(12) United States Patent
Endoh et al.

(10) Patent No.: US 8,623,139 B2
(45) Date of Patent: Jan. 7, 2014

(54) APPARATUS FOR PRODUCING POLYCRYSTALLINE SILICON

(75) Inventors: Toshihide Endoh, Suzuka (JP);
Masayuki Tebakari, Suzuka (JP);
Toshiyuki Ishii, Yokkaichi (JP);
Masaaki Sakaguchi, Suzuka (JP)

(73) Assignee: Mitsubishi Materials Corporation, Tokyo (JP)

( * ) Notice: Subject to any disclaimer, the term of this patent is extended or adjusted under 35 U.S.C. 154(b) by 1190 days.

(21) Appl. No.: 12/486,926

(22) Filed: Jun. 18, 2009

(65) Prior Publication Data

US 2009/0314207 A1    Dec. 24, 2009

(30) Foreign Application Priority Data

Jun. 24, 2008 (JP) ............... P2008-164298
Jun. 5, 2009 (JP) ............... P2009-135831

(51) Int. Cl.
*C30B 35/00* (2006.01)
*C23C 16/00* (2006.01)
(52) U.S. Cl.
USPC ............ 117/205; 117/200; 117/84; 117/88
(58) Field of Classification Search
USPC ............................ 117/200, 205, 84, 88
See application file for complete search history.

(56) References Cited

U.S. PATENT DOCUMENTS

| | | | | |
|---|---|---|---|---|
| 2,999,735 A | * | 9/1961 | Reuschel | 423/350 |
| 4,173,944 A | | 11/1979 | Koppl et al. | |
| 4,311,545 A | * | 1/1982 | Bugl et al. | 117/102 |
| 5,593,465 A | * | 1/1997 | Seifert et al. | 29/25.01 |
| 2002/0014197 A1 | * | 2/2002 | Keck et al. | 117/87 |
| 2006/0196854 A1 | * | 9/2006 | Severance, Jr. | 219/121.48 |
| 2007/0123964 A1 | * | 5/2007 | Davies et al. | 607/116 |

FOREIGN PATENT DOCUMENTS

| | | |
|---|---|---|
| CN | 2150208 Y | 12/1993 |
| CN | 2150508 Y | 12/1993 |
| DE | 2328303 A1 | 1/1975 |
| DE | 2432383 A1 | 1/1976 |
| JP | 61-281009 A | 12/1986 |
| JP | 2002338226 A * 11/2002 | C01B 33/021 |
| JP | 2007-107030 | 4/2007 |

OTHER PUBLICATIONS

Patent Abstracts of Japan, English Machine Translation of JP 2002-338226 (2013).*
European Search Report dated Oct. 16, 2009, issued on the corresponding European patent application No. 09 16 3297.6.
Office Action dated Aug. 3, 2012, issued in corresponding Chinese Application No. 2009-10150342.0.

* cited by examiner

*Primary Examiner* — Matthew Song
(74) *Attorney, Agent, or Firm* — Edwards Wildman Palmer LLP (57) ABSTRACT

An apparatus for producing polycrystalline silicon which heats a silicon seed rod in a reactor to which a raw material gas is supplied, and deposits polycrystalline silicon on the surface of the silicon seed rod, includes an electrode extending in a vertical direction to hold the silicon seed rod, an electrode holder having a cooling flow passage circulating a cooling medium formed therein, and inserted into a through-hole formed in a bottom plate of the reactor to hold the electrode, and an annular insulating material arranged between an inner peripheral surface of the through-hole and an outer peripheral surface of the electrode holder to electrically insulate the bottom plate and the electrode holder from each other.

15 Claims, 4 Drawing Sheets

APPARATUS FOR PRODUCING POLYCRYSTALLINE SILICON

BACKGROUND OF THE INVENTION

1. Field of the Invention

The present invention relates to an apparatus for producing polycrystalline silicon which deposits polycrystalline silicon on the surface of a heated silicon seed rod to produce a polycrystalline silicon rod.

Priority is claimed on Japanese Patent Application No. 2008-164298, filed Jun. 24, 2008, and Japanese Patent Application No. 2009-135831, filed Jun. 5, 2009, the content of which is incorporated herein by reference.

2. Description of Related Art

An apparatus employing Siemens method is known as an apparatus for producing polycrystalline silicon. In the apparatus for producing polycrystalline silicon using the Siemens method, a number of silicon seed rods are arranged in the reactor. The silicon seed rods in the reactor are heated, and raw material gas including mixed gas of chlorosilane gas and hydrogen gas is supplied to the reactor to come into contact with the heated silicon seed rods. On a surface of a silicon seed rod, polycrystalline silicon is produced by a hydrogen reduction reaction and a thermal decomposition reaction of the raw material gas.

In such an apparatus for producing polycrystalline silicon, the silicon seed rods are disposed so as to stand upright on the electrodes arranged at an inner bottom portion of the reactor. Then, an electric current is applied to the silicon seed rods from the electrodes, and the silicon seed rods generate heat by the resistance thereof. At this time, the raw material gas which is jetted from below is come into contact with the surfaces of the silicon seed rods to form polycrystalline silicon rods. A plurality of the electrodes holding the silicon seed rods is provided so as be distributed over almost the whole region of the inner bottom face of the reactor, and as described in Japanese Patent Unexamined Publication No. 2007-107030, is provided in through-holes of a bottom plate of the reactor so as to surrounded by an annular insulating material.

In the apparatus for producing polycrystalline silicon described above, the gas temperature in the reactor becomes elevated to 500 to 600° C. at a maximum. Thus, the electrode holders holding electrodes are cooled by circulating cooling water in the electrode holders. However, since the insulating material provided between the through-holes of a bottom plate of the reactor and the electrode holders cannot be directly cooled, the shape thereof is apt to be damaged due to the heat in the reactor, which is apt to cause deterioration of the insulating function. In this case, if a ceramic-based insulating material is used, there is a possibility that the insulating material will become damaged, since the insulating material is not be capable of absorbing the thermal expansion difference between the bottom plate of the reactor and the electrode holder.

SUMMARY OF THE INVENTION

The present invention was contrived in view of such a problem, and an object of the present invention is to provide an apparatus for producing polycrystalline silicon which can absorb the thermal expansion difference between a bottom plate of a reactor and the electrode holders, and can realize excellent insulation.

The apparatus for producing polycrystalline silicon of the present invention includes a reactor to which a raw material gas is supplied, and a silicon seed rod heated in the reactor, and deposits polycrystalline silicon on the surface of the silicon seed rod. The apparatus for producing polycrystalline silicon of the present invention has an electrode, an electrode holder, and an annular insulating material. The electrode extends in a vertical direction to hold the silicon seed rod. The electrode holder has a cooling flow passage formed therein for circulating a cooling medium, and the electrode holder is inserted into a through-hole formed in a bottom plate of the reactor to hold the electrode. The annular insulating material arranges between an inner peripheral surface of the through-hole and an outer peripheral surface of the electrode holder to electrically insulate the bottom plate and the electrode holder from each other. Furthermore, in the apparatus for producing polycrystalline silicon of the present invention, an outer peripheral surface of the electrode holder is provided with an enlarged diameter portion which contacts at least a portion of a top face of an upper end of the annular insulating material and has a portion of the cooling flow passage formed therein.

That is, the top face of the upper end of the annular insulating material in the state of being inserted into the bottom plate of the reactor is directed to the inside of the reactor. Thus, if the insulating material is kept in the state of being exposed into the reactor from a gap between the inner peripheral surface of the through-hole and the electrode holder, the radiant heat from the silicon seed rod or the like with the reactor will directly act on the upper end of the annular insulating material through the inner peripheral surface of the through-hole and the electrode holder. In this present invention, the electrode holder is provided with the enlarged diameter portion which contacts at least a portion of the top face of the upper end of the annular insulating material, whereby the electrode holder absorbs the radiant heat directed to the top face. Thus, the radiant heat which directly acts on the annular insulating material can be reduced. Moreover, since the cooling medium also circulates through the enlarged diameter portion, the cooling effect on the annular insulating material can be enhanced.

In the apparatus for producing polycrystalline silicon of the present invention, preferably, the enlarged diameter portion covers the whole top face of the upper end of the annular insulating material.

In this case, since the enlarged diameter portion is provided so as to cover the whole top face of the upper end of the annular insulating material whereby the radiant heat from the reactor is interrupted by the enlarged diameter portion, the annular insulating material can be more effectively protected from the radiant heat. Additionally, since the whole top face of the upper end of the annular insulating material is cooled by the enlarged diameter portion, deterioration of the shape and insulating function of the annular insulating material can be more effectively prevented.

In the apparatus for producing polycrystalline silicon of the present invention, preferably, the cooling medium cools the enlarged diameter portion, and then cools the vicinity of the electrode.

In this case, the cooling medium circulating through the inside of the electrode holder cools the enlarged diameter portion of a relatively low temperature, and then cools the vicinity of the electrode of a relatively high temperature, so that the enlarged diameter portion can be maintained at a low temperature. Thus, the temperature of the annular insulating material can be effectively prevented from reaching a high temperature.

In the apparatus for producing polycrystalline silicon of the present invention, preferably, the cooling flow passage has an outer peripheral flow passage through which the cooling medium is circulated at an outer peripheral portion in the electrode holder toward the upper end thereof along the longitudinal direction of the electrode holder, and an inner peripheral flow passage through which the cooling medium is circulated inside the outer peripheral flow passage toward the lower end of the electrode holder along the longitudinal direction, and a portion of the outer peripheral flow passage is formed in the enlarged diameter portion.

In this case, the cooling medium is circulated at the outer peripheral portion in the electrode holder toward the upper end of the electrode holder, and is then circulated inside the outer peripheral flow passage toward the lower end of the electrode holder, so that the electrode holder can be efficiently cooled to the upper end thereof.

In the apparatus for producing polycrystalline silicon of the present invention, preferably, the annular insulating material is made of resin having elasticity. In this case, damage to the annular insulating material caused by the thermal expansion difference between the bottom plate and the electrode holder is prevented, the thermal expansion difference between the bottom plate and the electrode holder is absorbed by an annular insulator, and displacement of the silicon seed rod and damage to deposited polycrystalline silicon are prevented.

According to the apparatus for producing polycrystalline silicon of the present invention, the enlarged diameter portion provided in the electrode holder intercepts the radiant heat from the silicon seed rod to the annular insulating material, and cools the annular insulating material. Thus, the annular insulating material can be effectively protected from the heat at the time of reaction, and the insulation and elasticity of the annular insulating material can be reliably maintained. Accordingly, synthetic resin or the like can be used as the annular insulating material, and the soundness of the whole apparatus can be maintained such that the thermal expansion difference can be absorbed while securing the insulation between the bottom plate and the electrode.

DETAILED DESCRIPTION OF THE INVENTION

Embodiments of an apparatus for producing polycrystalline silicon of the present invention will be described below with reference to the drawings.

First Embodiment

Figure 1:
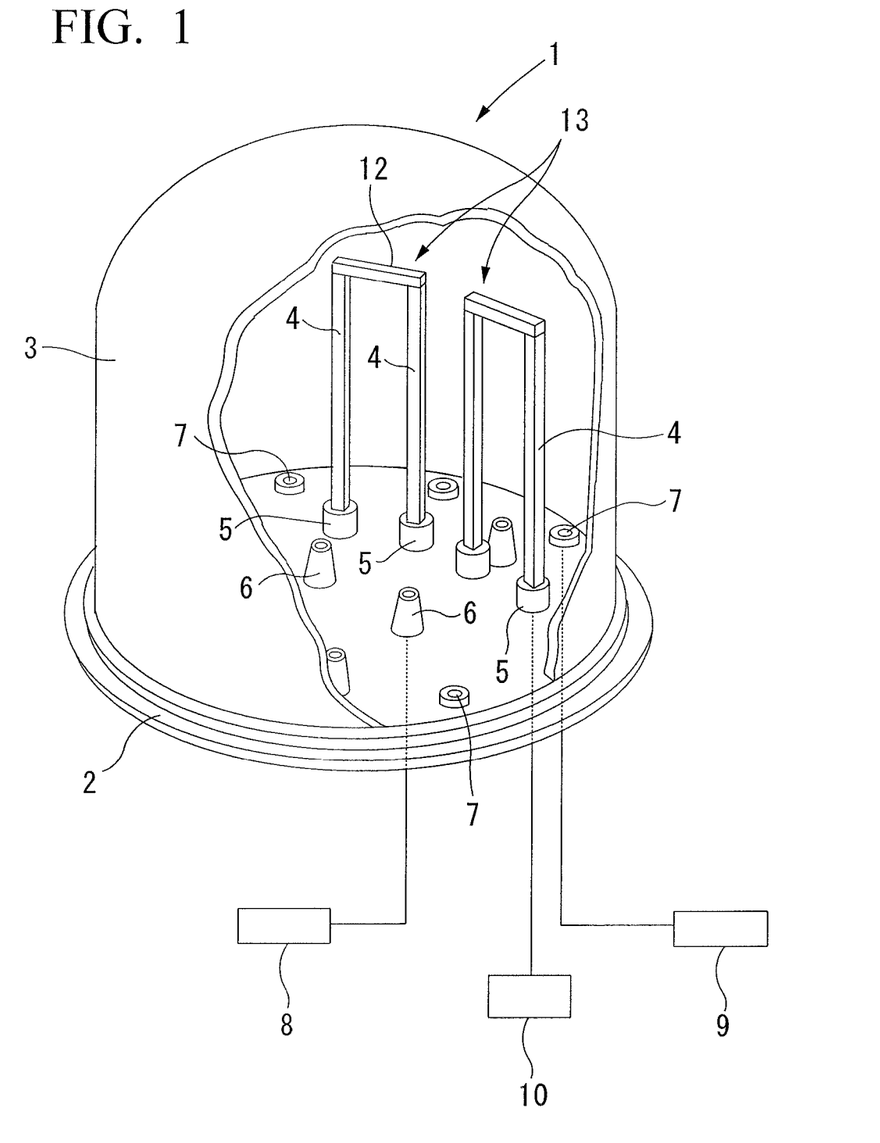
FIG. 1 is a partially cutaway perspective view of a bell jar of a reactor.

FIG. 1 is an overall view of the apparatus for producing polycrystalline silicon to which the present invention is applied. A reactor 1 of the apparatus for producing polycrystalline silicon includes a bottom plate 2 which constitutes a reactor bottom, and a bell-shaped bell jar 3 detachably attached on the bottom plate 2. The upper face of the bottom plate 2 is formed on a substantially flat horizontal plane. Since the bell jar 3 is bell-shaped as a whole, and the ceiling of the bell jar is dome-shaped, the internal space of the bell jar is formed such that the central portion thereof is the highest and the outer peripheral portion thereof is the lowest. Additionally, the bottom plate 2 and the wall of the bell jar 3 have a jacket structure (not shown), and are cooled by cooling water.

The bottom plate 2 is provided with a plurality of electrode units 5 to which silicon seed rods 4 are attached, a plurality of jet nozzles (gas supply ports) 6 for jetting a raw material gas including a chlorosilane gas and a hydrogen gas into the reactor, and a plurality of gas discharge ports 7 for discharging the gas after reaction to the outside of the reactor.

The plurality of the jet nozzles 6 for the raw material gas are distributed at suitable intervals over most of the upper face of the bottom plate 2 of the reactor 1 so that the raw material gas can be uniformly supplied to each of the silicon seed rods 4. The jet nozzles 6 are connected to a raw material gas supply source 8 outside the reactor 1. Additionally, the plurality of gas discharge ports 7 are set at suitable intervals in a circumferential direction in the vicinity of an outer peripheral portion on the bottom plate 2, and are connected to an exhaust gas processing system 9. A power supply circuit 10 is connected to the electrode units 5. The bottom plate 2 has a jacket structure, and the inside thereof is formed with a cooling flow passage (not shown).

The silicon seed rods 4 are fixed in a state where the lower ends thereof are inserted into the electrode units 5, respectively, and thereby extend upward so as to stand upright. One short connecting member 12 is attached to the upper ends of every two of the silicon seed rods 4 so as to connect them together as a pair. The connecting member 12 is also made of the same silicon as the silicon seed rods 4. A seed assembly 13 is assembled by these two silicon seed rods 4 and the connecting member 12 connecting these together so as to be substantially H-shaped (inversed U-shaped) as a whole. Since the electrode units 5 are arranged concentrically from the center of the reactor 1, seed assemblies 13 are arranged substantially concentrically from the center of the reactor 1.

Figure 2:
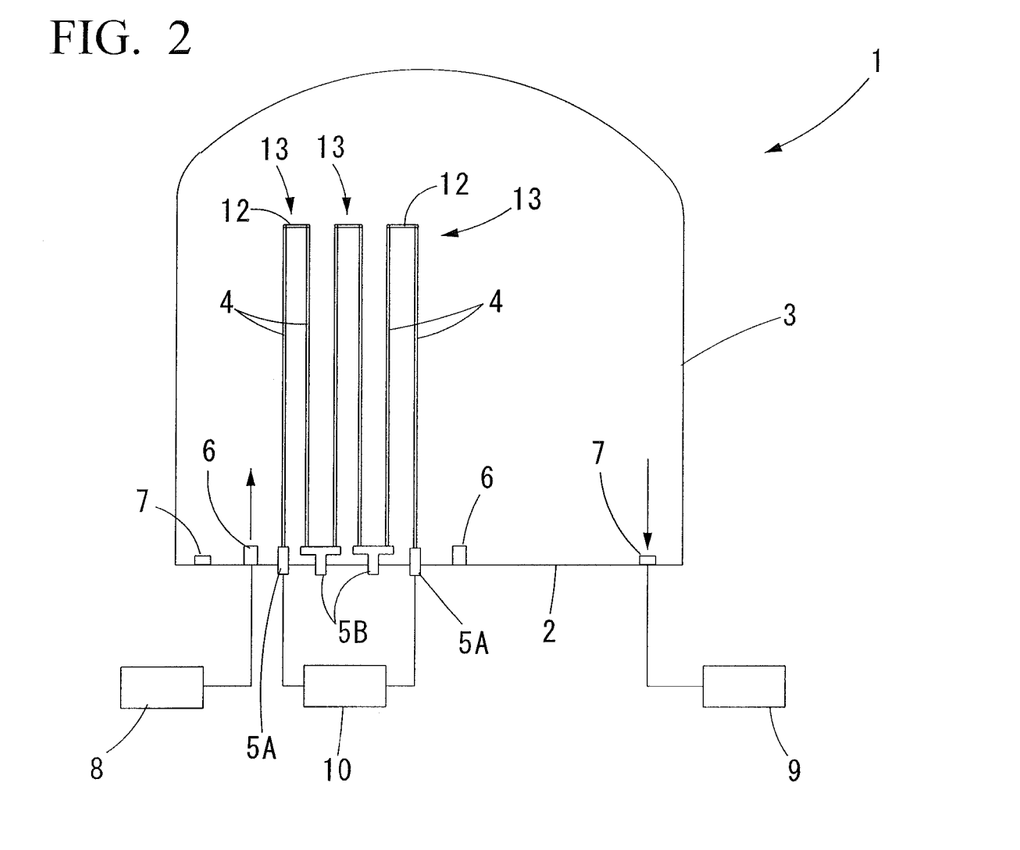
FIG. 2 is a sectional view of the reactor shown in FIG. 1.

Specifically, as shown in FIG. 2, electrode units 5A for one silicon seed rod holding one silicon seed rod 4 and electrode units 5B for two silicon seed rods holding two silicon seed rods 4 are arranged as the electrode units 5 in the reactor 1.

The electrode units 5A for one silicon seed rod and the electrode units 5B for two silicon seed rods, as shown in FIG. 2, are able to connect three sets of seed assemblies 13 in series as one unit. At this time, one electrode unit 5A for one silicon seed rod, two electrode units 5B for two silicon seed rods, and one electrode unit 5A for one silicon seed rod are lined up in this order from an end of a unit row. In this case, three sets of seed assemblies 13 are provided so as to stride over four electrode units 5A and 5B. Each of silicon seed rods 4 forming one seed assembly 13 is held by adjacent different electrode units 5, respectively.

That is, one of two silicon seed rods 4 of the seed assembly 13 is held at the electrode unit 5A for one silicon seed rod, and one silicon seed rod 4 of each of two sets of seed assemblies 13 is held at the electrode unit 5B for two silicon seed rods. A power cable is connected to the electrode units 5A for one silicon seed rod at both ends of the row so that an electric current flows thereto. At this time, in the electrode unit 5B for two silicon seed rods, an electric current flows between both electrodes 47 through an arm portion 42 (refer to FIG. 4).

As described above, two kinds of electrodes are used, and the electrode unit 5A for one silicon seed rod holding one silicon seed rod 4, and the electrode unit 5B for two silicon seed rods holding every two silicon seed rods 4 are provided. Thereby, the number of electrode units can be reduced (for example, about ⅔) compared with a case where all silicon rods are held one by one. In a case where the number of electrode units is small, the number of through-holes formed in the bottom plate 2 of the reactor 1 can also be reduced, and the bottom plate 2 can be maintained as a rigid structure. Additionally, since a number of silicon seed rods 4 can be held by a small number of electrode units, a number of silicon seed rods 4 can be set into the reactor 1, and productivity can be increased. Additionally, since the number of electrode units is reduced, cooling pipes or power cables to be arranged below the bottom plate 2 can also be reduced, and the maintenance workability thereof improves.

Next, the structure of each electrode unit will be described in detail.

Figure 3:
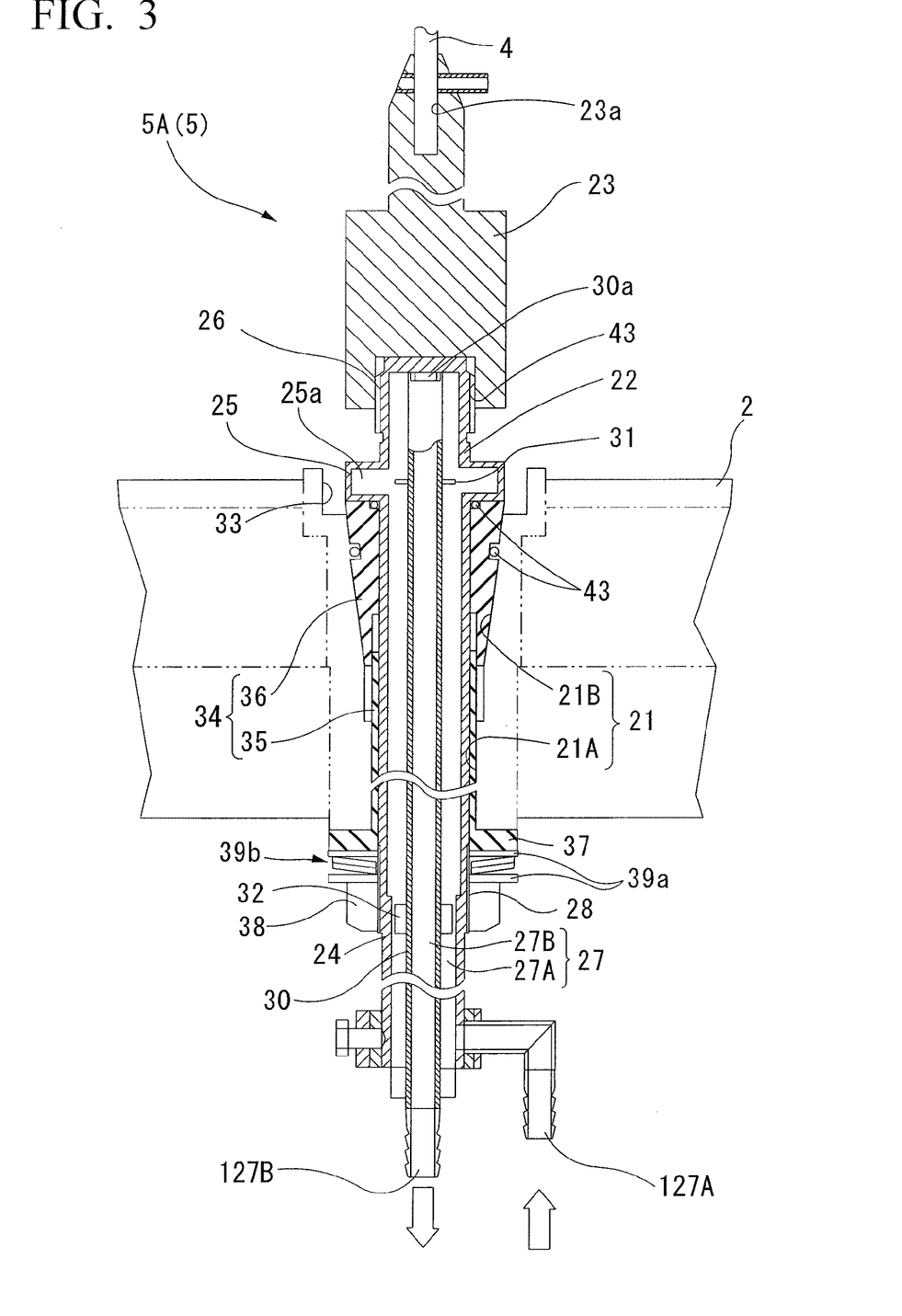
FIG. 3 is an enlarged sectional view showing an electrode unit for one silicon seed rod of the reactor shown in FIG. 2.

First, the electrode unit 5A for one silicon seed rod holding one silicon seed rod 4 will be described. As shown in FIG. 3, the electrode unit 5A includes an electrode holder 22 and an electrode 23. The electrode holder 22 is provided in the state of being inserted into a through-hole 21 formed in the bottom plate 2 of the reactor 1, and the electrode 23 is provided at the upper end of the electrode holder 22 to hold the silicon seed rod 4.

The electrode holder 22, as shown in FIG. 3, is formed in a rod shape, and made of a conductive material, such as stainless steel. The electrode holder 22 is formed by integrating a straight rod portion 24, a hollow disc-like enlarged diameter portion 25, and a male thread portion 26. The straight rod portion 24 is inserted into the through-hole 21 along a vertical direction. The hollow disc-like enlarged diameter portion 25 is coaxially formed at the upper end of the straight rod portion 24, and the enlarged diameter portion 25 has a diameter larger than that of the rod portion 24. A ring-shaped space 25a is formed in the enlarged diameter portion 25 coaxially with the electrode holder 22, and the space 25a has an outer diameter larger than the maximum diameter of the rod portion 24. The male thread portion 26 further protrudes upward from the top face of the enlarged diameter portion 25. Additionally, below the rod portion 24, a male thread portion 28 is formed at a position where it protrudes from the bottom plate 2.

The electrode holder 22 is formed in a hollow shape. Inside the electrode holder 22, an inner tube 30 which has a smaller external diameter than the internal diameter of the electrode holder 22 and divides the inside of the electrode holder 22 into an outer peripheral space and an inner peripheral space (core) is provided coaxially with the electrode holder 22. The upper end of the inner tube 30 abuts on the inner surface of the upper end of the electrode holder 22, and this upper end is formed with an opening 30a which allows the inside and outside of the inner tube 30 to communicate with each other. Thereby, a cooling flow passage 27 adapted such that an outer peripheral flow passage 27A formed between the inner tube 30 and the electrode holder 22 and an inner peripheral flow passage 27B formed in the inner tube 30 communicate with each other by the opening 30a is formed from the rod portion 24 to the male thread portion 26 inside the electrode holder 22. A cooling medium circulates through the cooling flow passage 27.

A ring plate 31 is provided at an outer peripheral surface of the inner tube 30 so as to be substantially orthogonal to the inner tube 30 at a position corresponding to the space 25a in the enlarged diameter portion 25. By means of the ring plate 31, the circulation direction of the cooling medium which circulates through the outer peripheral flow passage 27A is guided into the space 25a in the enlarged diameter portion 25. A plate-like spacer 32 which secures the spacing between the inner peripheral surface of the electrode holder 22 and the outer peripheral surface of the inner tube 30 at a position corresponding to the male thread portion 28 is further provided at the outer peripheral surface of the inner tube 30 so as to extend along the axis direction of the inner tube 30.

Meanwhile, the through-hole 21 of the bottom plate 2 in a state where the electrode holder 22 is inserted includes a lower straight portion 21A and an upper tapered portion 21B whose diameter gradually increased upward. The straight portion 21A is formed so as to have a larger internal diameter than the external diameter of the rod portion 24 of the electrode holder 22. Thereby, a ring-shaped space 25a is formed around the rod portion 24. The tapered portion 21B is formed at an inclination angle of, for example, 5° to 15° with respect to a vertical axis. An opening of an upper end of the tapered portion 21B is formed with a counterbore 33 whose diameter further increases than the maximum internal diameter of the tapered portion 21B.

An annular insulating material 34 is provided between the inner peripheral surface of the through-hole 21 and the rod portion 24 of the electrode holder 22 so as to surround the electrode holder 22. The annular insulating material 34 is formed from high-melting point insulating resin having elasticity, such as fluorine-based resin represented by, for example, polytetrafluoroethylene (PTFE) and perfluoroalkoxyalkane (PFA). The annular insulating material 34 includes two members of a sleeve 35 with a collar to be inserted into the straight portion 21A of the through-hole 21, and a cone member 36 arranged at the tapered portion 21B of the through-hole 21. For example, PTFE to be used as the material of the annular insulating material 34 has a melting point (ASTM standard: D792) of 327° C., and a bending elastic modulus (ASTM standard: D790) of 0.55 GPa, a tensile elastic modulus (ASTM standard: D638) of 0.44 GPa to 0.55 GPa, and a linear coefficient of expansion (ASTM standard: D696) of $10\times10^{-5}/°$ C.

The cone member 36 has an outer surface formed in a tapered shape of the same inclination angle as the inner peripheral surface of the tapered portion 21B of the through-hole 21. The cone member 36 is inserted into the through-hole 21 from above the bottom plate 2, and is made to abut on the inner surface of the tapered portion 21B of the through-hole 21. The bottom face of the enlarged diameter portion 25 of the electrode holder 22 abuts on the top face of an upper end of the cone member 36. The enlarged diameter portion 25 is set to have an external diameter that is almost equal to the maximum external diameter of the cone member 36, i.e., the external diameter of the top face of the upper end of the cone member 36, and covers the whole top face of the cone member 36 (annular insulating material 34). When the distance between the enlarged diameter portion 25 and the side face of the counterbore 33 is larger enough to avoid the short-circuit between the enlarged diameter portion 25 and the side face of the counterbore 33, it is preferable that the external diameter of the enlarged diameter portion 25 be slightly larger than the external diameter of the top face of the upper end of the cone member 36 to enhance the cooling effect on the annular insulating material. When the distance between the enlarged diameter portion 25 and the side face of the counterbore 33 is small, it is preferable that the external diameter of the enlarged diameter portion 25 be slightly smaller than the external diameter of the top face of the upper end of the cone member 36 to avoid the short-circuit between the enlarged diameter portion 25 and the side face of the counterbore 33.

O rings 43 are respectively provided at inner peripheral portion of upper end surface and the outer peripheral surface of the cone member 36. The airtightness between the cone member 36 and the electrode holder 22, and the airtightness between the cone member 36 and the bottom plate 2, i.e., the airtightness in the through-hole 21 of the reactor 1 are maintained by the O rings 43.

The sleeve 35 with a collar is inserted into the straight portion 21A so that a collar portion 37 integrally formed at a lower end thereof abuts on the rear surface of the bottom plate 2 of the reactor 1. The upper face of the collar portion 37 is pressed against the rear surface of the bottom plate 2 by a nut 38 threaded into the male thread portion 28 of the electrode holder 22. Pair of ring washers 39a and a disc spring 39b are arranged between the lower face of collar portion 37 and the nut 38, the disc spring 39b is arranged between the pair of ring washers 39a. While the upper face of the collar portion 37 is pressed against the rear surface of the bottom plate 2 by a nut 38, the press strength is adjusted appropriately by the disc spring 39b. It is preferable that the ring washers 39a be made of stainless steel (SUS304), and it is preferable that the disc spring 39b be made of stainless steel (SUS631).

Since the distance between the enlarged diameter portion 25 and the nut 38 becomes short by fastening the nut 38, the electrode holder 22 is pulled downward with respect to the bottom plate 2, and the annular insulated member 34 is sandwiched between the enlarged diameter portion 25 and the nut 38. Moreover, the outer peripheral surface of the cone member 36 is pressed against the inner peripheral surface of the tapered portion 21B of the through-hole 21 by the sandwiching force, and the annular insulating material 34 and the electrode holder 22 are integrally fixed to the bottom plate 2. At this time, while checking the height of the lower face of the enlarged diameter portion 25 of the electrode holder 22 from the bottom face of the counterbore 33, a lower portion of the enlarged diameter portion 25 approaches the bottom plate 2. At this time, the amount of screwing of the nut 38 is adjusted to prevent electric short-circuiting between a lower portion of the enlarged diameter portion 25 and the bottom plate 2.

By the elastic deformation of the disc spring 39b and the annular insulating material 34 (the sleeve 35 with a collar and the cone member 36 made of resin), the relative displacement in the vertical direction between the electrode holder 22 and the bottom plate 2 is permitted. Accordingly, the thermal expansion difference between the electrode holder 22 and the bottom plate 2 is absorbed.

In this fixed state, the upper end of the cone member 36 of the annular insulating material 34 protrude slightly upward from the upper end of the tapered portion 21B of the through-hole 21, and is made to face the counterbore 33. For this reason, the cone member 36 is set to have a larger external diameter than the maximum external diameter of the tapered portion 21B at the upper end thereof so as to protrude from the bottom face of the counterbore 33 and so as not to protrude upward from the upper end of the counterbore 33.

Meanwhile, the electrode 23 is formed in a columnar shape as a whole and made of carbon or the like. The electrode 23 has a female thread portion 43, which is screwed into the male thread portion 26 of the electrode holder 22, at the lower end thereof, and has a hole 23a, which fixes the silicon seed rod 4 in an inserted state, at the upper end thereof, and the hole 23a is formed along an axial center.

The cooling flow passage 27 formed in the electrode unit 5A for one silicon seed rod will be described. As shown in FIG. 3, a cooling medium flows into the outer peripheral flow passage 27A through an inlet 127A provided at the lower portion of the electrode holder 22, and circulates upward. Then, the cooling medium is guided by the ring plate 31 to circulate through the space 25a in the enlarged diameter portion 25, and then reaches the inside of the male thread portion 26, i.e., the vicinity of the electrode 23. When the inside of the outer peripheral flow passage 27A is filled with the cooling medium until the cooling medium contacts the inner surface of the upper end of the electrode holder 22, the cooling medium flows into the inner tube 30 from the opening 30a provided at the upper end of the inner tube 30. Then, the cooling medium circulates downward through the inside of the inner tube 30, i.e., the inner peripheral flow passage 27B, and flows to the outside of the electrode holder 22 from an outlet 127B provided at the lower end of the inner tube 30. That is, the cooling medium cools the enlarged diameter portion 25 at a relatively low temperature while circulating through the outer peripheral flow passage 27A, and then, cools the vicinity of the electrode 23 at a relatively high temperature, and is discharged from the electrode holder 22 through the inner peripheral flow passage 27B.

Second Embodiment

The electrode unit 5B for two silicon seed rods will be described. The electrode unit 5B for two silicon seed rods is shown in an enlarged manner in FIG. 4. The electrode unit 5B for two silicon seed rods has the same configuration as the electrode unit 5A for one silicon seed rod in that it includes an electrode holder 46 provided in the state of being inserted into the through-hole 21 formed at the bottom plate 2 of the reactor 1, and an electrode 47 provided at the upper end of the electrode holder 46. The electrode unit 5B for two silicon seed rods is different from the electrode unit 5A for one silicon seed rod in that the electrode holder 46 is bifurcated at the upper end thereof, and the electrodes 47 are respectively provided at both ends of the electrode holder 46.

Figure 4:
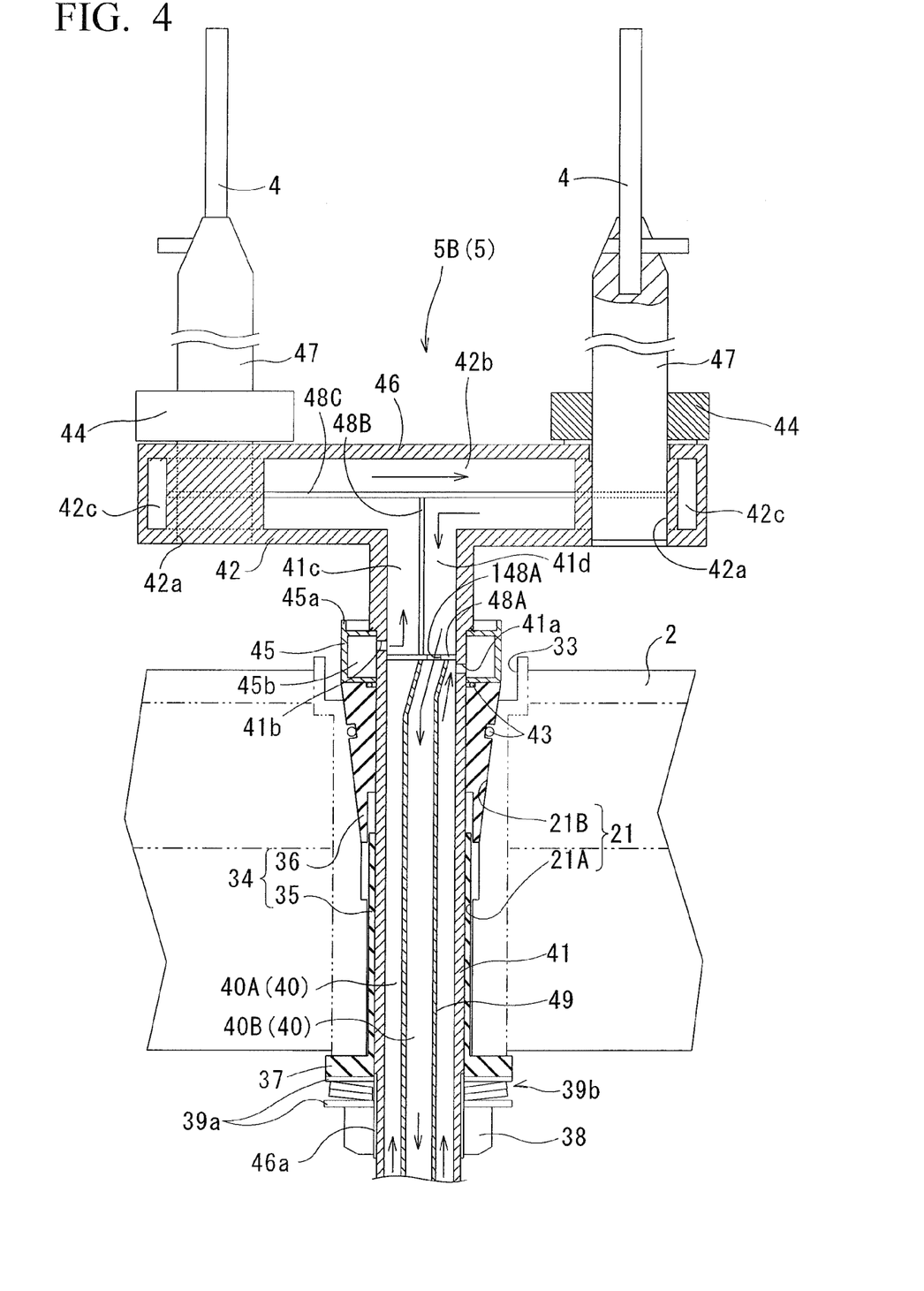
FIG. 4 is an enlarged sectional view showing essential portions of an electrode unit for two silicon seed rods of the reactor shown in FIG. 2.

The electrode holder 46 of the electrode unit 5B is configured such that a rod-shaped rod portion 41, and an arm portion 42 orthogonal to an upper end of the rod portion 41 are integrally formed. The electrode holder 46 is made of a conductive material, such as stainless steel. A hollow annular enlarged diameter portion 45 is attached to a longitudinal midway position of the rod portion 41. Additionally, the same male thread portion 46a as the male thread portion 28 in the first embodiment is formed at the position of the rod portion 41 protruding from the bottom face of the bottom plate 2.

Since the through-hole 21 (the straight portion 21A and the tapered portion 21B) of the bottom plate 2 in a state where the electrode holder 46 is inserted, the counterbore 33 formed at the opening of the upper end of the tapered portion 21B, the annular insulating material 34 (the sleeve 35 with a collar and the cone member 36) provided between the inner peripheral surface of the through-hole 21 and the rod portion 41 of the electrode holder 46, the nut member 38 screwed to the male thread portion 46a of the rod portion 41, the ring washers 39a, etc. have the same configuration and effects as the electrode unit 5A for one silicon seed rod, their description thereof will be omitted.

The arm portions 42 of the electrode holder 46 extends horizontally in right and left directions from the upper end of the rod portion 41, and the electrode holder 46 is formed to be T-shaped. The arm portion 42 is formed with female thread holes 42a which pass through both the right and left ends in a vertical direction. The electrodes 47 are screwed to the female thread holes 42a, and are exposed to upper portions of the arm portion 42. Nut members 44 are attached to base of the electrodes 47 on the arm portion 42. The nut members 44 are formed in a columnar shape, and the inner peripheral portions thereof are formed with female thread portions into which the electrodes 47 are screwed. It is preferable that the nut members 44 be made of carbon or the like.

The arm portion 42 is formed with a straight inner space 42b which extends in right and left directions, and a circular inner space 42c which surrounds the outer periphery of the female thread holes 42a in a C-shape, and communicates with the straight inner space 42b. The straight inner space 42b is partitioned into upper and lower portions by a third partition plate 48C.

The upper space of the rod portion 41 of the electrode holder 46 is partitioned into a left space 41c and a right space 41d by a second partition plate 48B to be connected to the third partition plate 48C. A disc-like first partition plate 48A which partitions the inside of the rod portion 41 into upper and lower portions in a direction substantially orthogonal to the axis direction of the rod portion 41 is connected to a lower end of the second partition plate 48B. The first partition plate 48A is formed with a through-hole 148A opened only to the right of the second partition plate 48B. Moreover, the rod portion 41 is formed with a first opening 41a provided below the first partition plate 48A, and a second opening 41b provided above the first partition plate 48A and opposite to the first opening 41a by 180° with the axis of the rod portion 41 therebetween.

The enlarged diameter portion 45 is an annular member which fits to an outer peripheral surface of the rod portion 41 and thereby forms an annular space 45b at the outer peripheral surface of the rod portion 41. The annular space 45b in the enlarged diameter portion 45 communicates with the inside of the rod portion 41 through the first opening 41a opened below the first partition plate 48A and the second opening 41b opened above the first partition plate 48A. Additionally, the outer peripheral portion of the top face of the enlarged diameter portion 45 is formed with a peripheral wall portion 45a.

Additionally, the inner tube 49 which communicates with the right space 41d through the through-hole 148A is attached to the bottom face of the first partition plate 48A substantially coaxially with the rod portion 41. The inner tube 49 divides the inside of the rod portion 41 into an outer peripheral space (outer peripheral flow passage 40A) and an inner peripheral space (inner peripheral flow passage 40B) below the first partition plate 48A.

By configuring the electrode unit 5B for two silicon seed rods in this way, a cooling flow passage 40 is formed inside the electrode holder 46 by the outer peripheral flow passage 40A and inner peripheral flow passage 40B at the lower portion of the rod portion 41, the annular space 45b of the enlarged diameter portion 45, the left space 41c and right space 41d at the upper portion of the rod portion 41, and the straight space 42b and circular space 42c of the arm portion 42.

In the cooling flow passage 40, a cooling medium flows into the outer peripheral flow passage 40A formed between the outer peripheral surface of the inner tube 49 and the inner peripheral surface of the rod portion 41 from the lower end of the electrode holder 46, and circulates upward. When the cooling medium reaches the first partition plate 48A, the cooling medium is interrupted by the first partition plate 48A, flows into the annular space 45b in the enlarged diameter portion 45 through the first opening 41a, and cools the enlarged diameter portion 45. Then, the cooling medium circulates to the upper side of the first partition plate 48A and the left side of the second partition plate 48B, i.e., to the left space 41c through the second opening 41b.

After the cooling medium which has flowed into the left space 41c is guided to the left circular inner space 42c from a lower left portion of the straight inner space 42b of the arm portion 42 by the second partition plate 48B and the third partition plate 48C. Then, the cooling medium circulates above the third partition plate 48C in the straight inner space 42b, and is guided to a lower right portion of the straight inner space 42b through the right circular inner space 42c. In this period, the cooling medium cools the vicinity of the electrode 47. Then, when the cooling medium circulates through the right space 41d along the second partition plate 48B and reaches the first partition plate 48A, the cooling medium flows into the inner peripheral flow passage 40B in the inner tube 49 through the through-hole 148A, and is discharged from the electrode holder 46.

In the apparatus for producing polycrystalline silicon configured in this way, an electric current is applied to the silicon seed rod 4 from each electrode unit 5 (the electrode unit 5A, the electrode unit 5B), bringing the silicon seed rod 4 into a resistance heating state. Additionally, even among the silicon seed rods 4, a silicon seed rod 4 receives radiant heat from an adjacent silicon seed rod 4, and is heated, and thereby, these silicon seed rods 4 are brought into a high-temperature state by a synergetic effect. As a result, the raw material gas which has contacted the surface of the silicon seed rod 4 in a high-temperature state reacts to deposit polycrystalline silicon.

Since the radiant heat from the silicon seed rods 4 acts also on each electrode unit 5A or electrode unit 5B on the bottom plate 2 of the reactor 1 and a portion of the upper end of the annular insulating material 34 which is weak to heat is also exposed in the counterbore 33, the influence of heat is concerned. However, as shown in FIGS. 3 and 4, since the enlarged diameter portion 25 of the electrode holder 22 and the enlarged diameter portion 45 of the electrode holder 46 are arranged on the top face of the upper end of the annular insulating material 34 so that they are covered, the radiant heat which directly acts on the upper end surface decreases. Moreover, since the electrode holder 22 or the electrode holder 46 is cooled by the cooling medium circulating therethrough, the annular insulating material 34 is also effectively cooled. In particular, the annular insulating material 34 is effectively cooled as the cooling medium circulates through the space provided inside the enlarged diameter portion 25 or the enlarged diameter portion 45 which covers the top face of the upper end thereof.

As such, since deformation, deterioration, etc. of the annular insulating material 34 caused by a high temperature are suppressed, and the elasticity thereof is maintained even in the hot reactor 1, the thermal deformation of each member can be absorbed, the action of stress can be suppressed, and the function of a facility is suitably maintained.

In addition, the present invention is not limited to the configuration of the above embodiment, but in the detailed configuration various modifications can be made without departing from the spirit and scope of the invention.

For example, the enlarged diameter portion of the electrode holder may be provided so as to cover at least a portion of the top face to such a degree that deformation, deterioration, etc. of the annular insulating material can be prevented. The enlarged diameter portion of the electrode holder does not necessarily cover the whole top face of the upper end surface of the annular insulating material.

Additionally, although a cooling flow passage of only one system is provided in the above embodiment, a cooling flow passage for cooling the enlarged diameter portion and a cooling flow passage for cooling the vicinity of an electrode may be provided independently.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An apparatus for producing polycrystalline silicon which heats a silicon seed rod in a reactor to which a raw material gas is supplied, and deposits polycrystalline silicon on the surface of the silicon seed rod, the apparatus comprising:

an electrode extending in a vertical direction to hold the silicon seed rod;

an electrode holder having a cooling flow passage circulating a cooling medium formed therein, and inserted into a through-hole formed in a bottom plate of the reactor to hold the electrode; and an annular insulating material arranged between an inner peripheral surface of the through-hole and an outer peripheral surface of the electrode holder to electrically insulate the bottom plate and the electrode holder from each other, wherein an outer peripheral surface of the electrode holder is provided with an enlarged diameter portion which contacts at least a portion of a top face of an upper end of the annular insulating material and has a portion of the cooling flow passage formed therein, the through-hole includes a lower straight portion and an upper tapered portion whose diameter gradually increases upward, an opening of an upper end of the tapered portion is formed with a counterbore whose diameter increases more than a maximum diameter of the tapered portion, and the enlarged diameter portion is disposed in the counterbore without contacting a side face of the counterbore.

2. The apparatus for producing polycrystalline silicon according to claim 1,
wherein the enlarged diameter portion covers the whole top face of the upper end of the annular insulating material.

3. The apparatus for producing polycrystalline silicon according to claim 1,
wherein the cooling medium cools the enlarged diameter portion, and cools the vicinity of the electrode.

4. The apparatus for producing polycrystalline silicon according to claim 1,
wherein the cooling flow passage has an outer peripheral flow passage through which the cooling medium is circulated at an outer peripheral portion in the electrode holder toward the upper end thereof along the longitudinal direction of the electrode holder, and an inner peripheral flow passage through which the cooling medium is circulated inside the outer peripheral flow passage toward the lower end of the electrode holder along the longitudinal direction, and a portion of the outer peripheral flow passage is formed in the enlarged diameter portion.

5. The apparatus for producing polycrystalline silicon according to claim 1,
wherein the annular insulating material is made of resin having elasticity.

6. The apparatus for producing polycrystalline silicon according to claim 1, wherein the electrode holder is formed in a hollow shape.

7. The apparatus for producing polycrystalline silicon according to claim 1, wherein the electrode holder is formed by integrating a straight rod portion, a hollow disc-like enlarged diameter portion, and a male thread portion.

8. The apparatus for producing polycrystalline silicon according to claim 1, wherein the enlarged diameter portion has a diameter larger than that of a rod portion of the electrode holder.

9. The apparatus for producing polycrystalline silicon according to claim 1, wherein a male thread portion of the electrode holder further protrudes upward from the top face of the enlarged diameter portion.

10. The apparatus for producing polycrystalline silicon according to claim 1, wherein the annular insulating material comprises a sleeve and a cone member.

11. The apparatus for producing polycrystalline silicon according to claim 1, wherein the cooling flow passage is arranged concentrically in the electrode holder.

12. The apparatus for producing polycrystalline silicon according to claim 1, wherein the annular insulating material includes a sleeve to be inserted into the straight portion and cone member arranged at the tapered portion,
an upper end of the cone member protrude upward from the upper end of the tapered portion, and
the upper end of the cone member is made to face the counterbore.

13. The apparatus for producing polycrystalline silicon according to claim 12, wherein the cone member is set to have a larger external diameter than the maximum external diameter of the tapered portion at the upper end thereof, so as to protrude from a bottom face of the counterbore and so as not to protrude upward from an upper end of the counterbore.

14. The apparatus for producing polycrystalline silicon according to claim 1, wherein the enlarged diameter portion has a hollow disc-like shape.

15. The apparatus for producing polycrystalline silicon according to claim 1, wherein the electrode holder has a configuration that
a rod-shaped rod portion and an arm portion orthogonal to an upper end of the rod portion are integrally formed,
the electrodes are respectively provided at both end of the arm portion, and
the enlarged diameter portion is attached to a longitudinal midway position of the rod-shaped rod portion.

* * * * *